(12) United States Patent
Menkus

(10) Patent No.: US 7,068,195 B1
(45) Date of Patent: Jun. 27, 2006

(54) ACCURATE SAMPLING TECHNIQUE FOR ADC

(75) Inventor: Christopher Alan Menkus, Munich (DE)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/119,199

(22) Filed: Apr. 29, 2005

(51) Int. Cl.
*H03M 1/00* (2006.01)
*H03L 7/00* (2006.01)

(52) U.S. Cl. .................. 341/141; 327/141; 375/354
(58) Field of Classification Search ............... 341/141, 341/155, 128, 129, 118, 120, 143, 161, 67; 327/291, 141, 298; 375/322, 222, 354; 702/57; 326/40

See application file for complete search history.

(56) References Cited

U.S. PATENT DOCUMENTS

| | | | | |
|---|---|---|---|---|
| 5,159,337 A * | 10/1992 | Lankreijer | ................... | 341/67 |
| 5,454,007 A * | 9/1995 | Dutta | ......................... | 375/322 |
| 5,541,602 A * | 7/1996 | Opris et al. | ................. | 341/161 |
| 5,621,408 A * | 4/1997 | Cake et al. | .................. | 341/143 |
| 5,745,394 A * | 4/1998 | Tani | ........................... | 708/313 |
| 5,821,794 A * | 10/1998 | Nazarian et al. | ............ | 327/298 |
| 5,963,885 A * | 10/1999 | Macq | .......................... | 702/57 |
| 6,108,371 A * | 8/2000 | Fadavi-Ardekani et al. | | 375/222 |
| 6,108,795 A * | 8/2000 | Jeddeloh | ...................... | 713/401 |
| 6,158,030 A * | 12/2000 | Reichle et al. | .............. | 714/724 |
| 6,384,756 B1 * | 5/2002 | Tajiri et al. | ................. | 341/120 |
| 6,414,612 B1 * | 7/2002 | Quesenberry | ............... | 341/120 |
| 6,518,905 B1 * | 2/2003 | Siferd | ........................ | 341/143 |
| 6,542,017 B1 * | 4/2003 | Manganaro | .................. | 327/291 |
| 6,600,438 B1 * | 7/2003 | Hilton | ......................... | 341/155 |
| 6,608,581 B1 * | 8/2003 | Semenov | ..................... | 341/155 |
| 6,639,956 B1 * | 10/2003 | Song | .......................... | 375/354 |
| 6,798,241 B1 * | 9/2004 | Bauer et al. | .................. | 326/40 |
| 6,882,192 B1 * | 4/2005 | Gau | ............................ | 327/141 |
| 6,982,664 B1 * | 1/2006 | Nairn | ......................... | 341/118 |

OTHER PUBLICATIONS

National Semiconductor Corporation, "A/D Converter," web article, *Signal News*, no month 2004 (2 pages).
National Semiconductor, "ADC08D1000 High Performance, Low Power, Dual 8-Bit, 1 GSPS A/D Converter," Sep. no date 2004 (31 pages).
Ozan E. Erdogan, et al., "A 12b Digital-Background-Calibrated Algorithmic ADC with -90dB THD," *IEEE*, Feb. 17, 1999 (3 pages).

(Continued)

*Primary Examiner*—Patrick Wamsley
(74) *Attorney, Agent, or Firm*—Brett A. Hertzberg; Merchant & Gould

(57) ABSTRACT

A time interleaved ADC system includes a delay circuit that has a dynamically adjusted speed to achieve uniformly spaced sampling intervals. The adjustment control circuit monitors the sampling pulses associated with sampling time instant for each ADC, and provides one or more control signals to the delay circuit. In one example, the adjustment control circuit employs a phase detector circuit, an integrator circuit, and a dynamic biasing circuit. In this example, the phase detector circuit evaluates the sampling pulses to generate control signals for the integrator circuit, which generates signals that are utilized by the dynamic biasing circuit to adjust the delays associated with the delay circuit. The relative positions of the sampling pulses are controlled by adjusting the delay in the delay circuit.

21 Claims, 9 Drawing Sheets

OTHER PUBLICATIONS

Michael Choi, et al., "A 6b 1.3GSample/s A/D Converter in 0.35pm CMOS," *IEEE*, Feb. 6,2001 (3 pages).

Rudy J. Van De Plassche et al., "A High-Speed 7 Bit A/D Converter," *IEEE*, Dec. 6, 1979 (6 pgs).

Kevin Kattmann et al., "A Technique for Reducing Differential Non-Linearity Errors in Flash A/D Converters," *IEEE*, Feb. 14, 1991 (2 pgs).

Klaas Bult et al., "An Embedded 240-mW 10-b 50-MS/s CMOS ADC in 1-mm$^2$," *IEEE*, Dec. 12, 1997 (9 pgs).

Opris et all, "A Single-Ended 12b 20MSample/s Self-Calibrating Pipeline A/D Converter," *ISSCC*, Feb. 6, 1998 (3 pgs).

D. Fu et al., "Digital Background Calibration of a 10b 40MSamples/s Parallel Pipelined ADC," *ISSCC*, Feb. 6, 1998 (3 pgs).

K. Dyer et al., "Analog Background Calibration of a 10b 40MSample/s Parallel Pipelined ADC," *IEEE*, Feb. 17, 1999 (3 pgs).

William Ellersick et al., "GAD: A 12-GS/s CMOS 4-bit A/D converter for an Equalized Multi-Level Link," *Symposium on VLSI Circuits Digest of Technical Papers* no month 1999 (4 pgs).

Jun Ming et al., "An 8b 80MSample/s Pipelined ADC with Background Calibration," *IEEE*, Feb. 7, 2000 (3 pgs).

Kouji Sushihara et al., "WP 26.2 A 6b 800MSample/s CMOS A/D Converter," *IEEE*, Feb. 9, 2000 (2 pgs).

Krishnaswamy Nagaraj, et al., "A Dual-Mode 700-Msamples/s 6-bit 200-Msamples/s 7-bit A/D Converter in a 0.25-µm Digital CMOS Process," *IEEE* Dec. 12, 2000 (9 pgs).

Govert Geelen, "A 6b 1.1GSample/s CMOS A/D Converter," *IEEE*, Feb. 6, 2001 (3 pgs).

Robert C. Taft et al., "A 100-Ms/s 8-b CMOS Subranging ADC with Sustained Parametric Performance from 3.8 V Down to 2.2 V," *IEEE*, Mar. no date 2001 (8 pgs).

Naoki Kurosawa et al., "Explicit Analysis of Channel Mismatch Effects in Time-Interleaved ADC Systems," *IEEE*, Mar. no date 2001 (11 pgs).

Peter Scholtens et al., "A 6b 1.6Gsample/s Flash ADC in 0.18 µm CMOS using Averaging Termination," *ISCC*, Feb. 5, 2002 (3 pgs).

Ken Poulton et al., "A 4GSample/s 8b ADC in 0.35 µm CMOS," *ISSCC*, Feb. 5, 2002 (3 pgs).

Po-Hui Yang et al., "Low-Voltage Pulsewidth Control Loops for SOC Applications," *IEEE*, Oct. no date 2002 (4 pgs).

Shafiq M. Jamal et al., "A 10-b 120-Msample/s Time-Interleaved Analog-to-digital Converter with Digital Background Calibration," *IEEE*, Dec. 12, 2002 (10 pgs).

Ken Poulton et al., "A 20GS/s 8b ADC with a 1MB Memory in 0.18 µm CMOS," *IEEE*, no month 2003 (10 pgs).

Xicheng Jiang et al., "A 2GS/s 6b ADC in 0.18 µm CMOS," *IEEE*, Feb. 12, 2003 (10 pgs).

Robert Taft et al., A 1.8V 1.6GS/s 8b Self-Calibrating Folding ADC with 7.26 ENOB at Nyquist Frequency, *IEEE*, Feb. 17, 2004 (2 pgs).

Robert C. Taft et al., "A 1.8-V 1.6-GSample/s 8-b Self-Calibrating Folding ADC with 7.26 ENOB at Nyquist Frequency," *IEEE*, Dec. 12, 2004 (9 pgs).

\* cited by examiner

US 7,068,195 B1

ACCURATE SAMPLING TECHNIQUE FOR ADC

FIELD OF THE INVENTION

The present disclosure generally relates to analog-to-digital converter (ADC) circuits. More particularly, the present disclosure relates to a technique to precisely align clock edges such that sampling in an ADC system can be achieved at a higher frequency than the frequency associated with an input clock.

BACKGROUND

An analog-to-digital converter (ADC) is a device that takes an analog input signal (e.g., VIN) and converts it into an N-bit digital signal (e.g., $d_{N-1} \ldots d_0$). The resulting N-bit digital signal is associated with a discrete quantized version of the analog input signal. In some instances, the quantization of the analog input signal is provided in a coded form such as binary coded decimal (BCD).

ADCs may employ a wide variety of architectures, such as integrating, successive-approximation, flash, and delta-sigma architectures. In general, the process of analog-to-digital conversion starts with sampling the analog input signal at some periodic rate. Each sample of the analog input signal is typically evaluated by comparing the sampled analog input signal to one or more reference signals. The differences between the reference signals and the sampled analog input are evaluated by comparator circuits, whose outputs are processed by a digital encoder circuit.

An ADC is a key building block in many mixed-mode integrated circuits (ICs). Once the analog signal is converted into the digital domain, complicated signal processing functions can be performed with easier handling and improved noise immunity. In one instance, the digital signals are stored as in a data-logging function. In another instance, the stored digital signals are processed to provide digital signal processing functions, or some other numerical analysis.

BRIEF DESCRIPTION OF THE DRAWINGS

Non-limiting and non-exhaustive embodiments are described with reference to the following drawings.

DETAILED DESCRIPTION

Figure 1A:
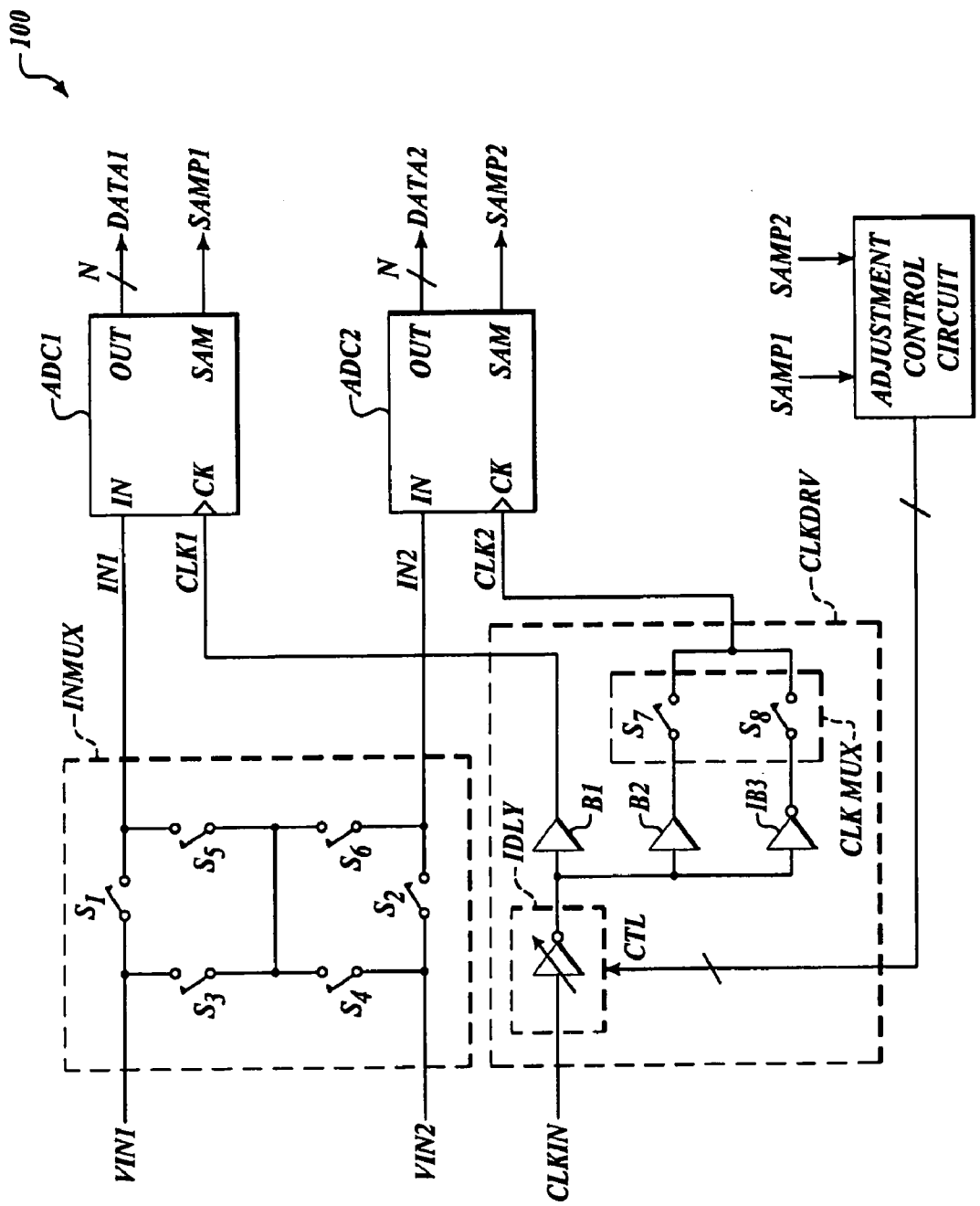
FIG. 1A is a schematic diagram of an ADC system.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity Briefly stated, the present disclosure generally relates to a time interleaved ADC system that includes a delay circuit that has a dynamically adjusted speed to achieve uniformly spaced sampling intervals. The adjustment control circuit monitors the sampling pulses associated with sampling time periods for each ADC, and provides one or more control signals to the delay circuit. In one example, the adjustment control circuit employs a phase detector circuit, an integrator circuit, and a dynamic biasing circuit. In this example, the phase detector circuit evaluates the sampling pulses to generate control signals for the integrator circuit, which generates signals that are utilized by the dynamic biasing circuit to adjust the delays associated with the delay circuit. The relative positions of the sampling pulses are controlled by adjusting the delay in the delay circuit.

General System Concept

FIG. 1A is a schematic diagram of an example ADC system (100). ADC system 100 includes an input multiplexer circuit (INMUX), a clock driver circuit (CLKDRV), two analog-to-digital converter (ADC) circuits (ADC1 and ADC2), and an adjustment control circuit (ADJ).

The input multiplexer circuit includes a set of switching circuits (S1–S6), which are arranged to selectively couple at least one of two input signals (e.g., VIN1 and VIN2) to at least two input signal paths (IN1 and IN2). In a first operating mode, the first input signal (VIN1) is coupled to the first input signal path (IN1) and the second input signal (VIN2) is coupled to the second input signal path (IN2) via the switching circuits (e.g., S1 and S2). In a second operating mode, the first input signal (VIN1) is coupled to the first input signal path (IN1) and the second input signal path (IN2) via the switching circuit (e.g., S3, S5 and S6). In a third operating mode, the second input signal (VIN2) is coupled to the first input signal path (IN1) and the second input signal path (IN2) via the switching circuit (e.g., S4, S5 and S6).

The clock driver circuit (CLKDRV) is arranged to receive an input clock signal (CLKIN) and provide two clock signals (CLK1 and CLK2). For this example, the clock driver circuit (CLKDRV) includes two non-inverting buffer circuits (B1, B2), an inverting buffer circuit (IB3), and an adjustable delay circuit (IDLY). The adjustable delay circuit (IDLY) is responsive to a control signal (CTL), which may be a single signal or multiple signals, and is arranged to change the position of at least one edge of the first clock signal (CLK1) relative to the input clock signal (CLKIN). The second clock signal (CLK2) may be selected as either in phase with the first clock signal, or inverted with respect to the first clock signal by selection via a clock multiplexer circuit (e.g., switching circuits S7 and S8).

ADC circuit ADC1 is coupled to the first input signal path (IN1) and a first clock signal (CLK1), and arranged to provide a first N-bit data output signal (DATA1) and a first sampling pulse signal (SAMP1). ADC circuit ADC2 is coupled to the second input signal path (IN2) and a second clock signal (CLK2), and arranged to provide a second N-bit data output signal (DATA2) and a second sampling pulse signal (SAMP2).

In the first operating mode, ADC1 is arranged to receive the first input signal, ADC2 is arranged to receive the second input signal, and the clock signals may be selected as in phase with one another such that two separate data streams are provided from the output of the analog-to-digital converter circuits. In the second operating mode, ADC1 and ADC2 are arranged to receive the first input signal, and the clock signals (CLK1, CLK2) are selected out of phase with one another such that the outputs of the converters can be interleaved as a single data stream operated at twice the input clock frequency. In the third operating mode, ADC1 and ADC2 are arranged to receive the second input signal, and the clock signals (CLK1, CLK2) are selected out of phase with one another such that the outputs of the converters can be interleaved as a single data stream operated at twice the input clock frequency. The adjustment control circuit is arranged to vary the control signal or signals for the adjustable delay circuit (IDLY) in response to the sample pulse signals (SAMP1, SAMP2) from the converters.

Interleaved Operation

The second and third operating modes described above permit interleaved sampling operation. Time-interleaved operation of two ADC circuits has the same effect on conversion resolution as operating a single ADC circuit at twice the clock frequency for one of the individual ADC circuits. However, interleaved operation of two ADC circuits has less timing jitter than operating a clock doubling circuit, and also permits each ADC to operate at a lower overall operating frequency.

Sampling instant mismatch (static timing offset) remains in the interleaved ADC system, and may create an unwanted tone in the digital output data's frequency spectrum at the frequency (Fsamp/2)–Fin, where Fin is the analog input frequency. To alleviate the static timing offset problem, the sampling clocks for the first and second ADC circuit should be operated 180° out of phase from each other. In one example system, a 1 ps timing offset can degrade the ADC performance for a 1 GHz signal input. For interleaved operation, the out of phase clock signal (e.g., CLK2) is routed to one ADC circuit (e.g., ADC2), and the in phase clock signal (e.g., CLK1) is routed to the other ADC circuit (e.g., ADC1). In other words, the positive polarity clock signal is routed to one ADC, and an inverted version clock signal is routed to the other ADC.

The duty cycle of the input clock, asymmetries in the internal clock receiver, and mismatches in buffering and routing of signals can influence the sampling time accuracy. Accurate and jitter-free sample clock spacing is generated by the selective control of the delay of one or more edges associated with the relative timing between the input clock signal (CLKIN) and the other clock signals (CLK1, CLK2) via the adjustment control circuit and the adjustable delay circuit (IDLY). Since the circuits have an adaptive control topology, one where the adjustment is a free running dynamic adjustment, temperature and power supply variations do not impair the overall performance of the system. In other words, the imperfections in the system (e.g., semiconductor process based variations, mismatch errors, offset errors, temperature based errors, etc.) are handled within the control loop for the clock signals such that excellent performance is achieved despite such imperfections.

Figure 1B:
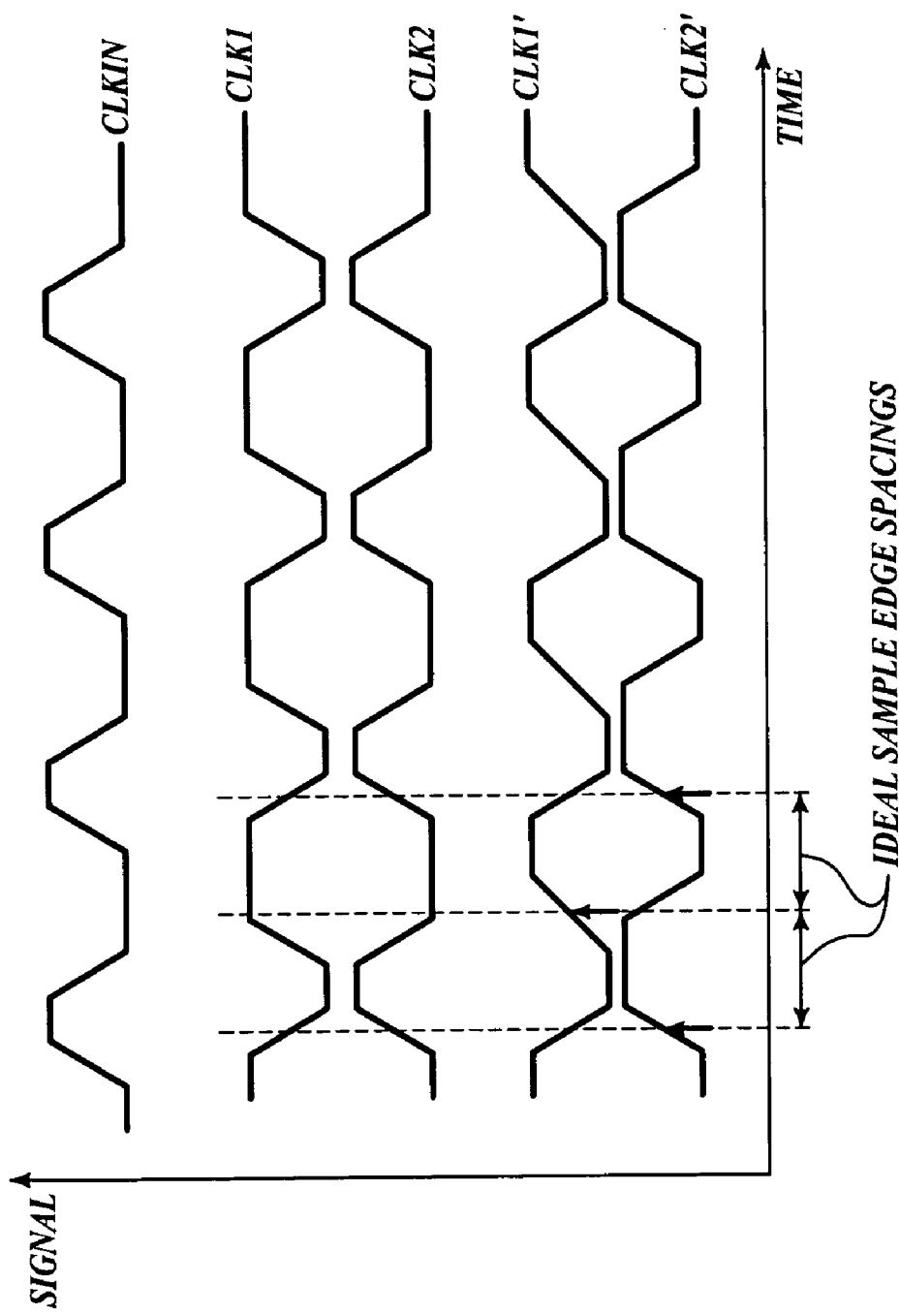
FIG. 1B is a timing diagram for the ADC system.

FIG. 1B is a timing diagram for the ADC system illustrated in FIG. 1A. The input clock signal (CLKIN) may have an asymmetric duty cycle as is illustrated. Prior to adjustment of the delay circuit, clock signals CLK1 and CLK2 may result, where the clock signals are inverses of one another with a duty cycle that is matched to the input clock signal duty cycle. After adjustment with the delay circuit, clock signals CLK1' and CLK2' may result, where the rising and falling edges of clock signal CLK1' are not matched to one another. However, clock signals CLK1' and CLK2' have equidistant transitions of the sampling edge for the ADC circuit (e.g., the times where the rising edges of clock signals CLK1' and CLK2' pass the sampling circuit threshold voltage occur at regularly spaced intervals).

Example Systems

Figure 2:
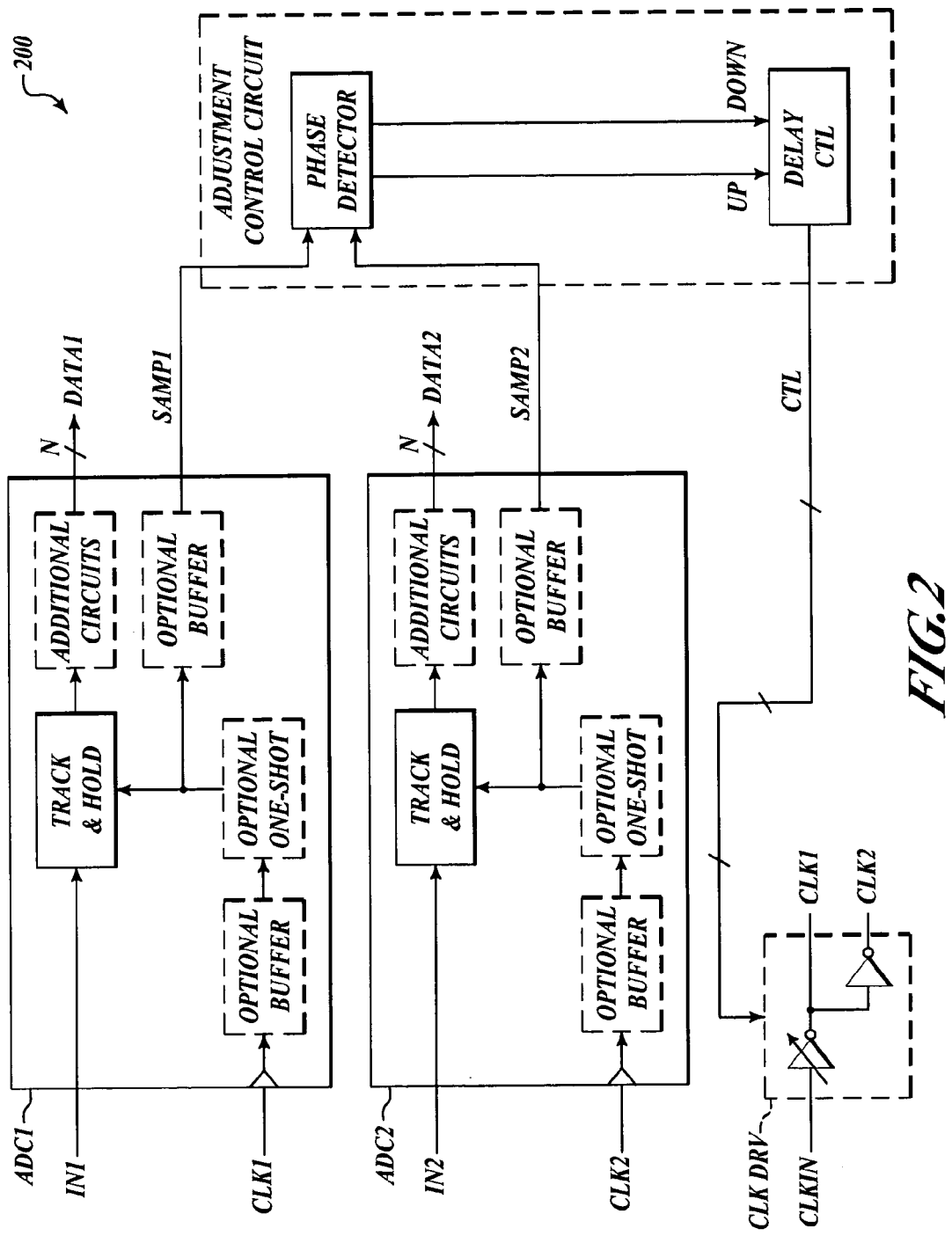
FIG. 2 is a schematic diagram of another ADC system.

FIG. 2 is a schematic diagram of another example ADC system (200), that includes a clock driver circuit (CLKDRV), an adjustment control circuit, and two ADC circuits (ADC1, ADC2). For this example circuit, the clock driver circuit (CLKDRV) includes one adjustable delay circuit and one inverter circuit, the adjustment control circuit includes a phase detector and a delay control circuit.

Each ADC circuit in system 200 includes a track and hold (or sample and hold) circuit that is arranged to sample an input signal (IN) in response to a clock signal (CLK1 or CLK2). Each clock signal (e.g., CLK1) may optionally be buffered in the respective ADC circuit. An optional one-shot circuit may be employed to shape the sampling clock in such as a way as to improve the performance of the track and hold circuit. An optional output buffer may be used to provide the sampling signal (e.g., SAMP1 or SAMP2) to the adjustment control circuit from the respective one of the ADC circuits, such that loading effects and/or noise pick-up effects can be minimized. The output of each track and hold circuit is coupled to additional circuits that provide the conversion of the analog input signal to a digital quantity.

The sampling signals from ADC1 and ADC2 correspond to the sampling instant phase (e.g., the sample clock edges from each ADC) and are used as inputs to a phase detector circuit. The output of the phase detector circuit (e.g., UP and DOWN) may be utilized by the delay control circuit to adjust the rising and/or falling edges associated with the clock signals (CLK1, CLK2) relative to the input clock signal (CLKIN).

Figure 3:
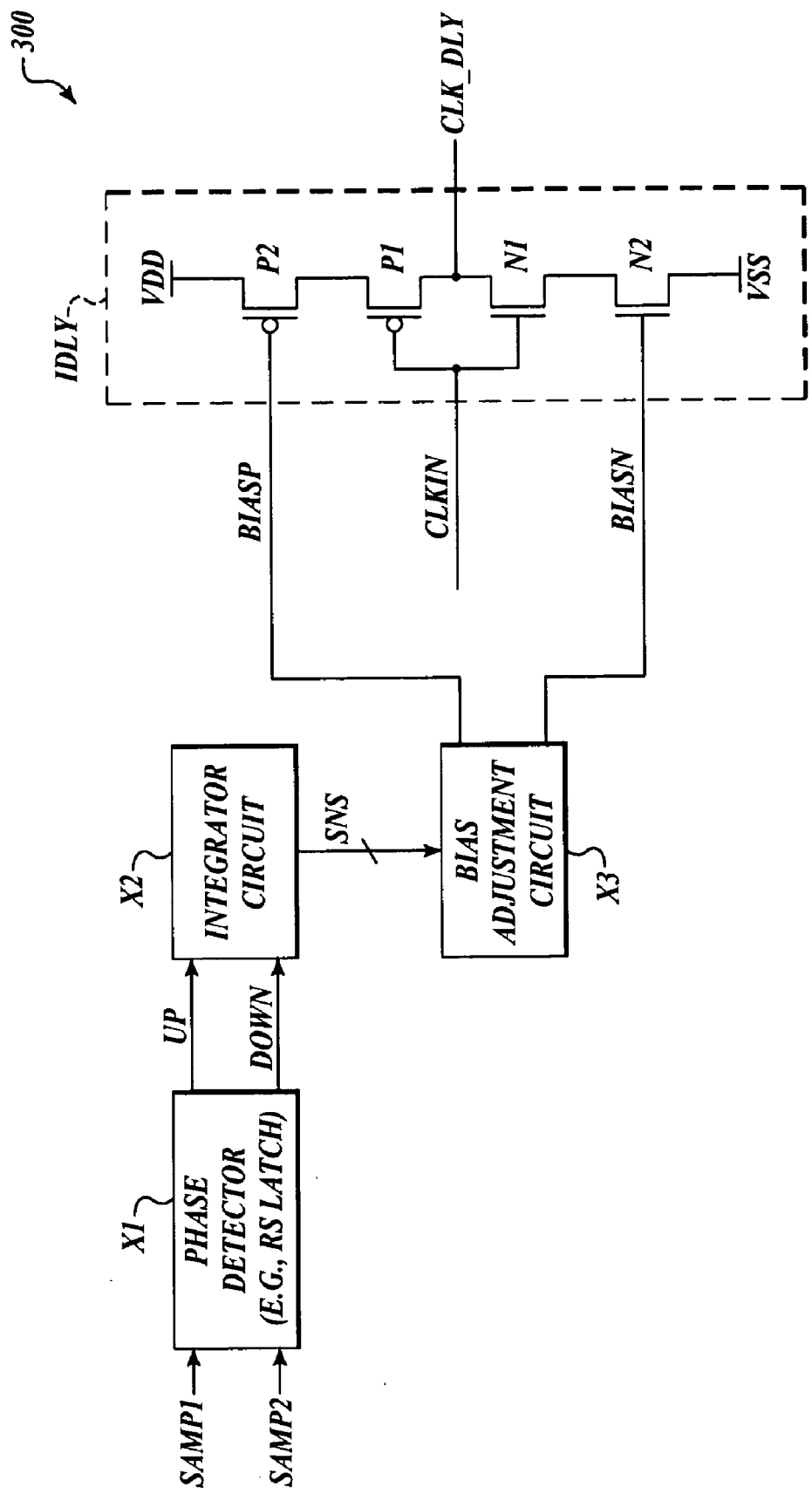
FIG. 3 is a schematic diagram of an adjustment control circuit and an adjustable delay circuit.

FIG. 3 is a schematic diagram of an adjustment control circuit and an adjustable delay circuit (300). The adjustment control circuit includes a phase detector circuit (X1), an integrator circuit (X2), and a bias adjustment circuit (X3). The adjustable delay circuit (IDLY) includes two transistors (P1, N1) that are configured as an inverter circuit. Two additional biased transistors (P2, N2) are configured to cooperate with the inverter circuit (P1, N1) to control the edge speed for rising edges and falling edges in response to the biasing signals (BIASP, BIASN).

The phase detect circuit (X1) may be a Set-Reset latch type circuit which upon detecting a logic high on a first input generates a logic high on a first output, and then upon detecting a logic high on a second input clears the first output to logic low and sets a second output to logic high. The output polarity of the phase detector circuit reverses when the first input is again detected high, and so on. The integrator circuit (X2) is responsive to the output (or outputs) of the phase detector circuit (X1) to generate one or more sense signals (SNS). A single sense signal may be generated for a single-ended implementation, while two sense signals may be generated for differential implementations. The sense signals may correspond to error voltages (which may be filtered or averaged) that are proportional to the non-ideal timing difference (or timing error) between the clock edges for CLK1 and CLK2.

The error voltages may be used to adjust the rising and falling edge times of the adjustable delay circuit (IDLY) to generate a delayed clock signal (CLK_DLY) from the input clock signal (CLKIN). The clock edges for the clock signals (CLK1 and CLK2) are derived from the delayed clock signal (CLK_DLY).

The pulse width of the high pulse is affected by the BIASP signal since the rate of increase in the CLK_DLY voltage is reduced when the BIASP signal increases, and vice-versa. The pulse width of the low pulse is affected by the BIASN signal since the rate of decrease in the CLK_DLY voltage is reduced when the BIASN signal decreases, and vice-versa. When the BIASP transistor is strongly biased and the BIASN transistor is weakly biased, the CLK_DLY signal will have a fast rise time and a slow fall time such that the sampling clock edges move away from one another. When the BIASP transistor is weakly biased and the BIASN transistor is strongly biased, the CLK_DLY signal will have a slow rise time and a fast fall time such that the sampling clock edges move towards one another. The feedback operation of the phase detector, integrator, and bias adjustment circuit will thus dynamically adjust the edges of the sampling clock signals to achieve uniformly spaced sampling clock intervals.

Although two bias voltages (BIASP, BIASN) are illustrated as adjusting the rising and falling edges associated with the output of the adjustable delay circuit (IDLY), two voltages are not necessary in every implementation. In one example, only BIASN is employed and only the falling edge speed is adjustable. In another example, only BIASP is employed and only the rising edge speed is adjustable. In still another example, BIASP and BIASN are the same signal such that the rising and falling edges are adjusted together in unison. In still yet another example, BIASP and BIASN are adjusted relative to one another such as through level shifters, or current mirrors as will be discussed later.

Figure 4:
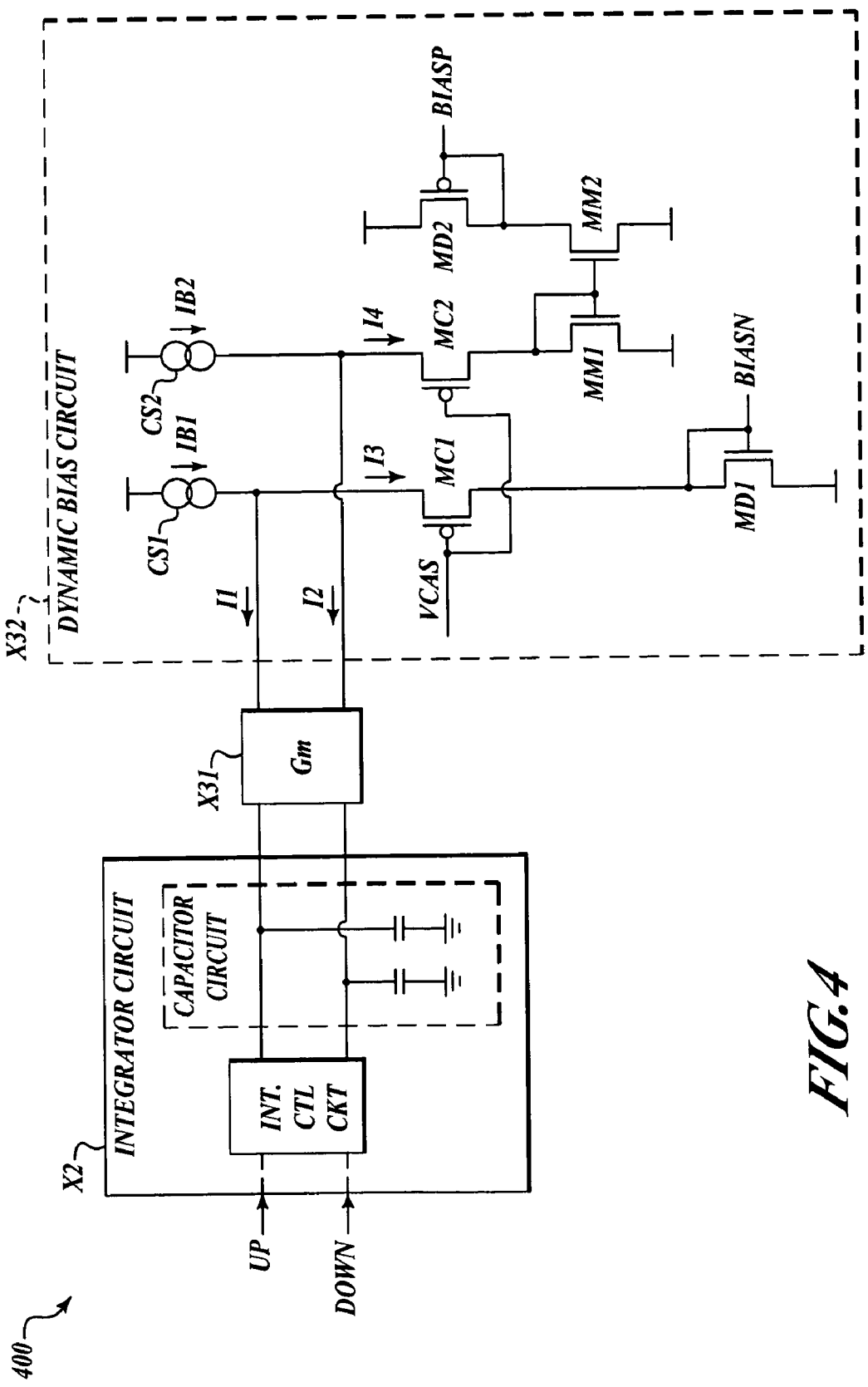
FIG. 4 is a schematic diagram of another adjustment control circuit with a dynamic bias circuit.

FIG. 4 is a schematic diagram of another adjustment control circuit with a dynamic bias circuit (400). The adjustment control circuit includes an integrator circuit (X1), a transconductance (Gm) circuit (X2), and a dynamic bias adjustment circuit (X3). The adjustable delay circuit (not shown) may be similar to that shown previously in FIG. 3, or some other topology that provides similar functionality in response to one or more biasing signals (BIASP, BIASN). The integrator circuit (x1) includes a capacitor circuit and an integration control circuit. The integrator circuit is arranged such that one or more error voltages are developed by the capacitor circuit. Once the clock signals (e.g., CLK1, CLK2) are 180° out of phase, the difference between the two error voltages associated with the capacitor circuits will stabilize at a settled value that is associated with the timing error between the clock signals.

The dynamic bias circuit (X3) includes first and second current sources (CS1, CS2) to provide currents IB1 and IB2. The transconductance circuit (X2) steals current (e.g., I1, I2) away from the dynamic bias circuit transistors resulting in current I3=IB1−I1 and current I4=IB2−I2. Transistor MC1 receives current I3 while transistor MC2 receives current I4. Diode coupled transistor MD1 is arranged to generate bias signal BIASN in response to current I3. Diode coupled transistor MD2 is arranged to generate bias signal BIASP in response to current I4 via a current mirror circuit (e.g., MM1 and MM2). Bias signal BIASP and BIASN stabilize once the clock signals (CLK1, CLK2) are 180° out of phase.

Figure 5:
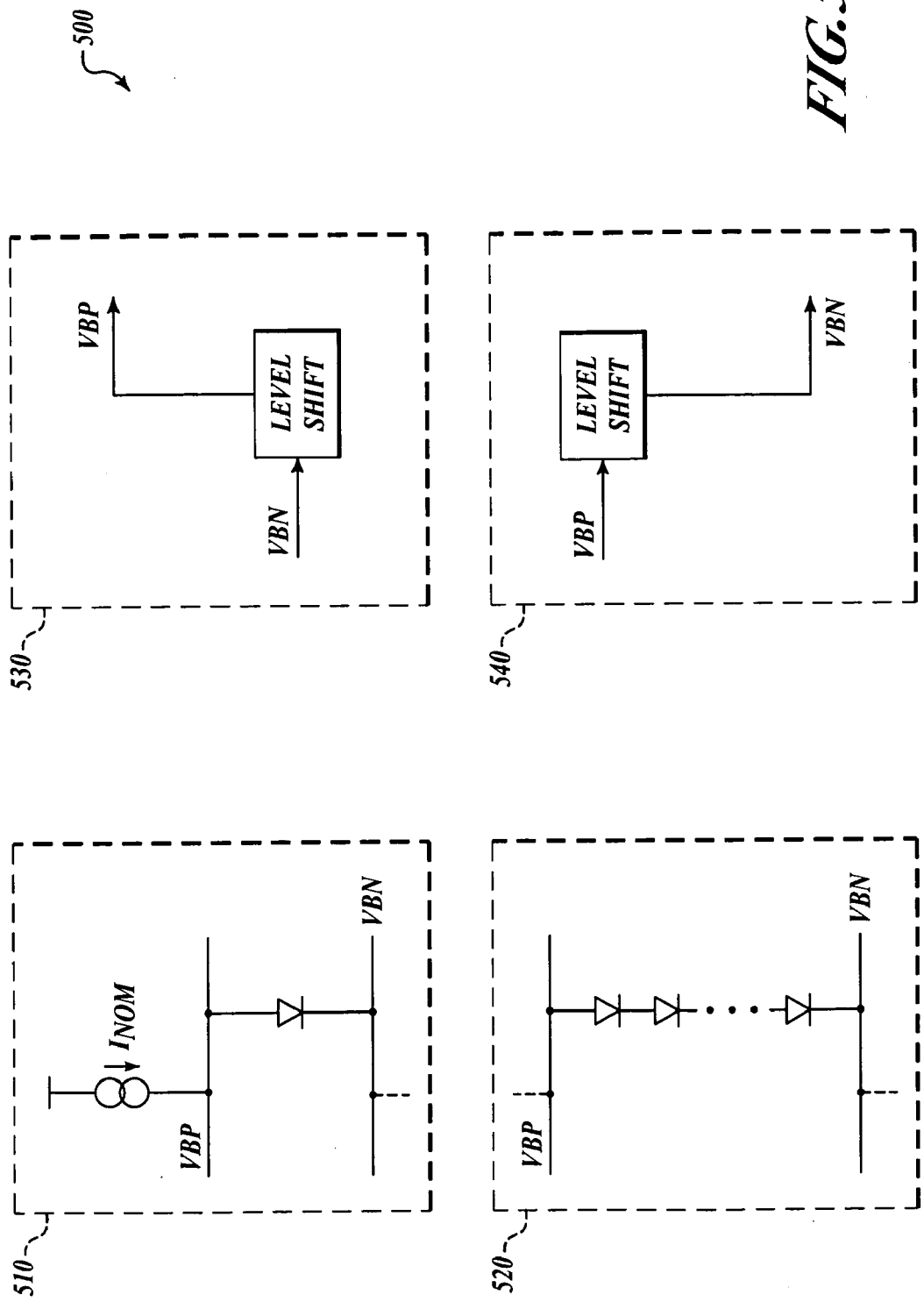
FIG. 5 is a schematic diagram of bias circuit arrangements.

FIG. 5 is a schematic diagram of additional non-limiting example bias circuit arrangements (500). For each of the following examples, VBP and VBN are related to BIASP and BIASN previously discussed. Bias circuit arrangement 510 employs a single diode circuit that is arranged to generate a DC drop between the VBP and VBN biasing signals. Bias circuit arrangement 520 employs two or more series coupled diode circuits that are arranged to generate a DC drop between the VBP and VBN biasing signals. Bias circuit arrangement 530 employs a level shifter circuit to generate the VBP bias signal in response to the VBN bias signal, while bias circuit arrangement 540 similarly employs a level shifter circuit to generate the VBN bias signal in response to the VBP bias signal. Other example bias circuit arrangements may also be employed without departing from the scope of the present disclosure.

Figure 6:
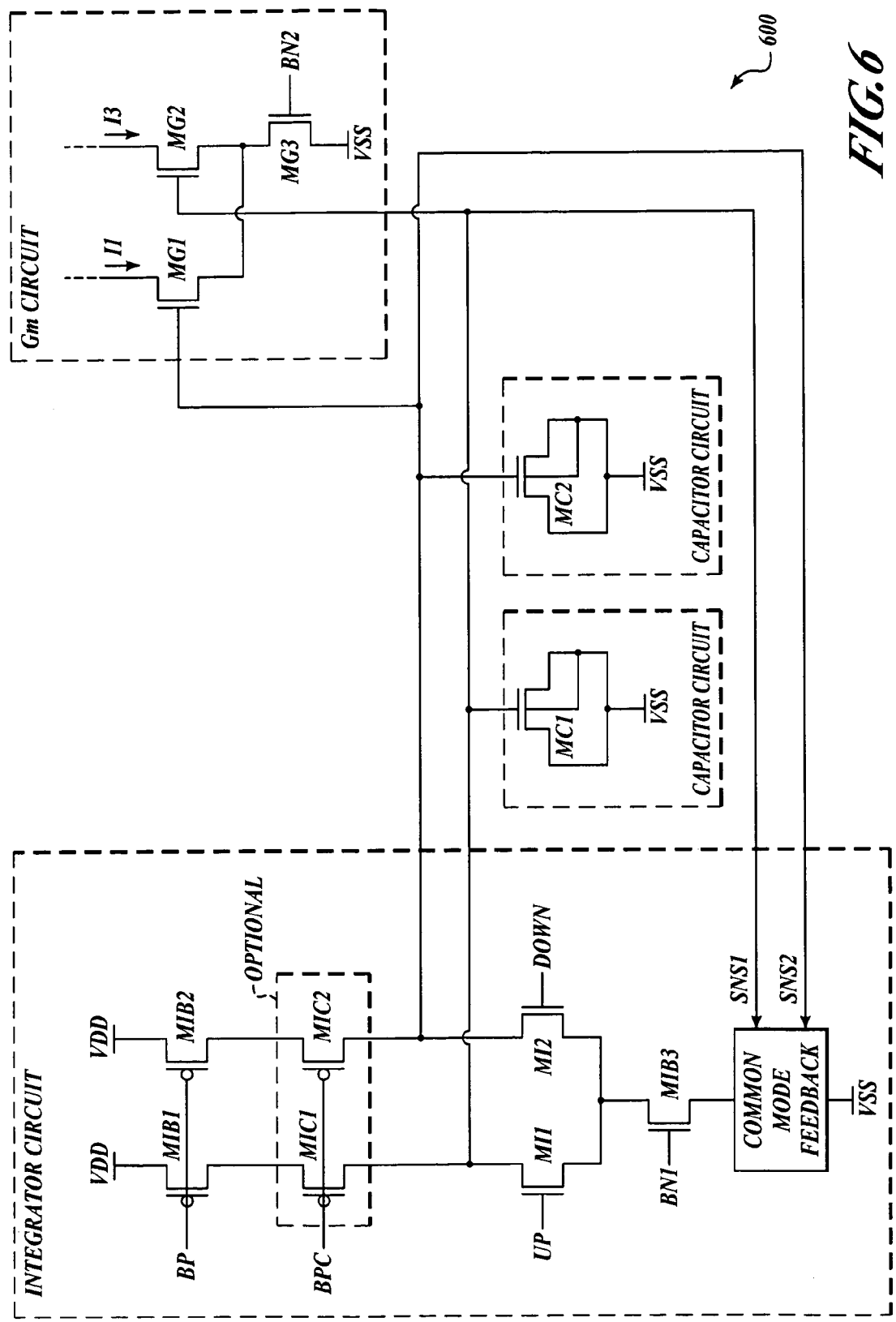
FIG. 6 is a schematic diagram of an integrator circuit and a transconductance circuit.

FIG. 6 is a schematic diagram of an integrator circuit and a tranconductance, hereafter Gm, circuit (600). The example integrator circuit includes current source transistors MIB1, MIB2 that are biased by signal BP, optional cascode transistors MIC1, MIC2 that are biased by signal BPC, input transistors MI1 and MI2, a tail current source (e.g., transistor MIB3 which is biased by signal BN1), and a common-mode feedback circuit. One capacitor circuit (e.g., gate capacitor MC1) is coupled to the drain of transistor MI1, while the other capacitor circuit (e.g., gate capacitor MC2) is coupled to the drain of transistor MI2.

Input signals UP and DOWN should not be asserted at the same time. When input signal UP is asserted, transistor MI1 is active and the voltage associated with the drain of transistor MI1 will decrease. When input signal UP is deasserted, transistor MI1 is inactive and the current source (MIB1) will increase the voltage at the drain of transistor MI1 by charging the respective capacitor circuit. When input signal DOWN is asserted, transistor MI2 is active and the voltage associated with the drain of transistor MI2 will decrease. When input signal DOWN is deasserted, transistor MI2 is inactive and the current source (MIB2) will increase the voltage at the drain of transistor MI2 by charging the respective capacitor circuit. The common-mode feedback circuit senses the levels associated with the capacitor voltages as SNS1 and SNS2, and adjusts the tail current for the input transistors. The Gm circuit includes transistors MG1 and MG2, arranged as a differential pair with tail current source MG3 (which is biased by BN2), which are responsive to signals SNS1 and SNS2 to steal currents I1 and I2 as described previously.

Figure 7A:
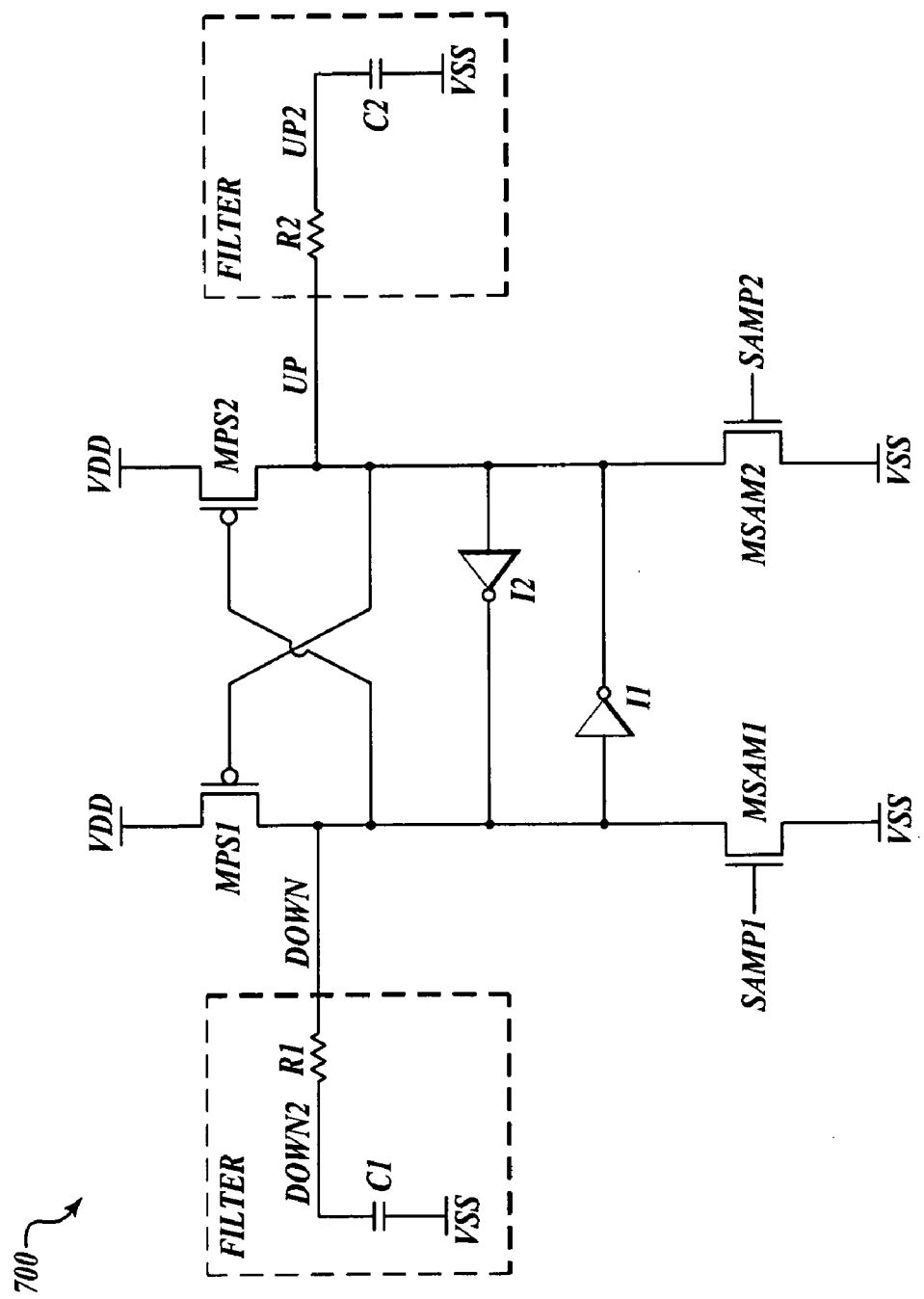
FIG. 7A is a schematic diagram for a phase detector circuit.
Figure 7B:
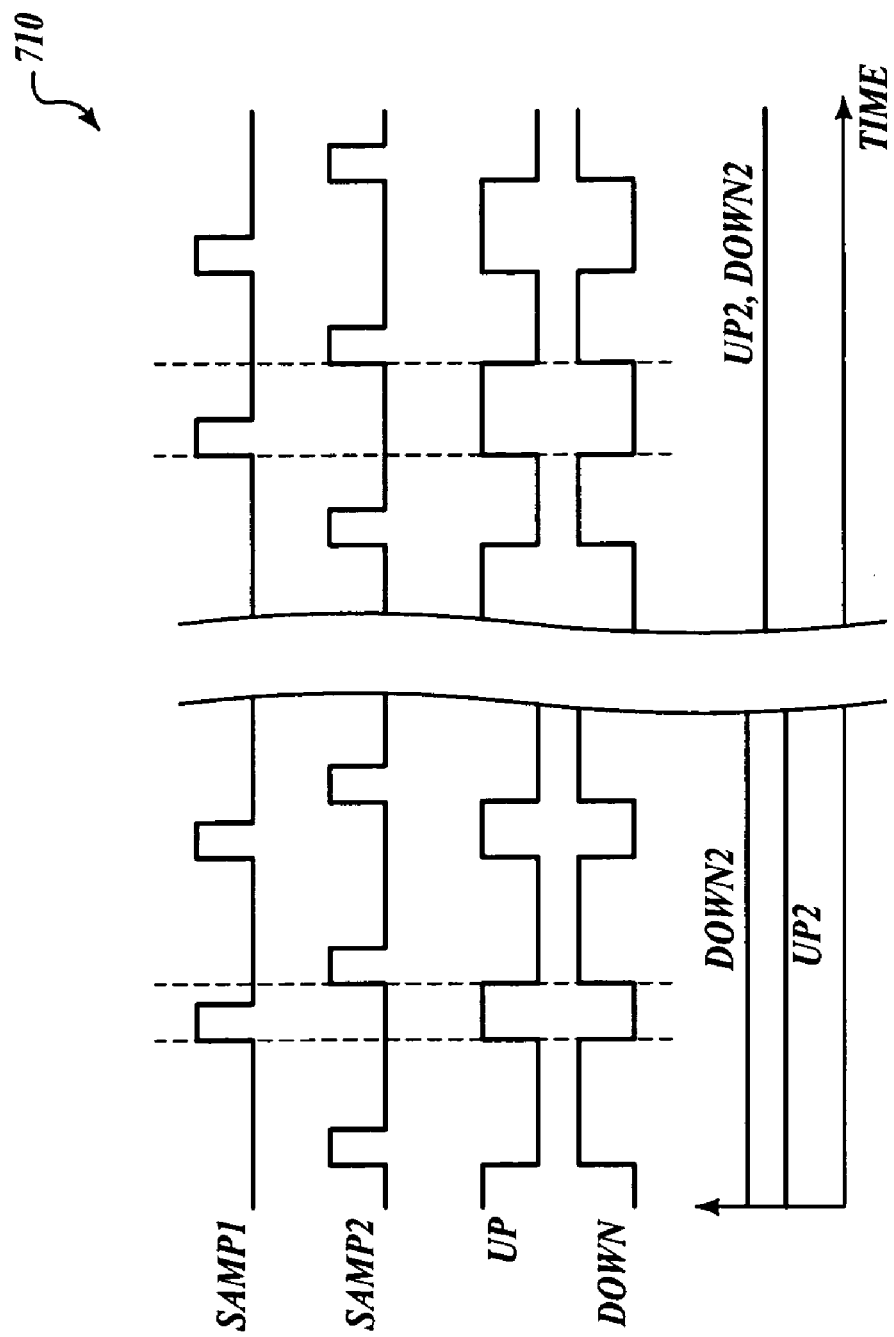
FIG. 7B is a timing diagram for the phase detector circuit.

FIG. 7A is a schematic diagram for a phase detector circuit (700). FIG. 7B is an timing diagram (710) for the example phase detector circuit (700). The phase detector circuit includes transistors MPS1, MPS2, MSAM1 and MSAM2, inverters I1 and I2, resistors R1 and R2, and capacitors C1 and C2.

Resistor R1 and capacitor C1 are arranged in a filter configuration for the DOWN signal, while resistor R2 and capacitor C2 are arranged in the filter configuration for the UP signal. The gate of transistor MPS1 and the drain of transistor MPS2 are coupled to UP, while the gate of transistor MPS2 and the drain of transistor MPS1 are coupled to DOWN. Inverter I1 is coupled between DOWN and UP, while inverter I2 is coupled between UP and DOWN.

Signals SAMP1 and SAMP2 should not be active at the same time as illustrated by FIG. 7B. Transistor MSAM1 is responsive to signal SAMP1 to set the DOWN signal to a logic 0 level, and transistor MPS2 is arranged to set the UP signal to logic 1 level once signal DOWN has decreased sufficiently for latching operation. Similarly, transistor MSAM2 is responsive to signal SAMP2 to set the UP signal to a logic 0 level, and transistor MPS1 is arranged to set the DOWN signal to logic 1 level once signal UP has decreased sufficiently for latching operation. Inverters I1 and I2 hold the latched state of the UP and DOWN signals when transistors MSAM1 and MSAM2 are both inactive.

The filters formed by the resistors and capacitors dampen the response of the phase detector circuit such that filtered voltages can be provided as the UP2 and DOWN2 output signals. When a large phase error exists (i.e., SAMP1 and SAMP2 are not 180 degrees out of phase), then a difference exists in the approximately DC values of the UP2 and DOWN2 signals. After timing differences are corrected by the feedback loop, the phase error is corrected and no significant difference exists between the UP2 and DOWN2 signals.

The two filtered voltages may be used as inputs to an integrator circuit, which holds the voltage difference until timing correction takes place. The integrator output node (see previous discussion) has a large capacitance circuit that forms a dominant pole in the feedback loop such that loop stability is maintained. A transconductance circuit converts the integrator output voltage into a differential current (or single ended, depending on system implementation).

The current changes caused by the transconductance circuit are arranged to alter the biasing of the delay circuit to change the rising and/or falling edge speeds. Very little additional jitter is introduced to the sample clocks in the double-speed mode compared to the normal mode because very little additional circuitry comes between the adjusted clock signal (e.g., CLK1, or CLK2) and the internal sampling circuit of the ADC (e.g., the track & hold circuit).

Although the invention has been described herein by way of exemplary embodiments, variations in the structures and methods described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention is not limited except as by the appended claims.

What is claimed is:

1. An apparatus for converting an analog input signal to a digital output signal, the apparatus comprising:
   a first analog-to-digital converter circuit that includes a first analog input port, a first sampling clock input port, and a first digital output port;
   a second analog-to-digital converter circuit that includes a second analog input port, a second sampling clock input port, and a second digital output port, wherein the first and second digital output ports are arranged to provide portions of the digital output signal in a time interleaved format when the first and second analog input ports are coupled to one another;
   an adjustment control circuit that is arranged to monitor sampling signals associated with the first and second analog-to-digital converter circuits, and also arranged to provide at least one control signal; and
   a clock driver circuit that is arranged to: receive an input clock signal, receive the at least one control signal, provide a first clock signal to the first sampling clock input port, and provide a second clock signal to the second sampling clock input port, wherein the clock driver circuit includes an adjustable delay circuit that is responsive to the at least one control signal.

2. The apparatus of claim 1, wherein the adjustment control circuit comprises a phase detector circuit and a delay control circuit, wherein the phase detector circuit is arranged to generate an UP signal and a DOWN signal in response to the monitored sampling signals, and wherein the delay control circuit is arranged to generate the at least one control signal in response to the UP and DOWN signals.

3. The apparatus of claim 2, wherein the UP and DOWN signals are filtered signals.

4. The apparatus of claim 1, wherein the adjustment control circuit comprises an integrator circuit, a transconductance circuit, and a dynamic bias circuit, wherein: an output of the integrator circuit is coupled to the transconductance circuit, and an output of the transconductance circuit is coupled to the dynamic bias circuit.

5. The apparatus of claim 4, wherein the integrator circuit is configured to operate in either: a single-ended configuration or a differential configuration.

6. The apparatus of claim 4, wherein the transconductance circuit is arranged to draw current from the dynamic bias circuit.

7. The apparatus of claim 4, wherein the dynamic bias circuit comprises a diode coupled transistor that is coupled to a current source that provide a first current, and wherein the transconductance circuit is arranged to selectively divert current from the diode coupled transistor such that a voltage associated with the diode coupled transistor is varied.

8. The apparatus of claim 1, wherein the adjustment control circuit comprises an integrator means, a transconductance means, and a dynamic bias means, wherein: an output of the integrator means is coupled to the transconductance means, and an output of the transconductance means is coupled to the dynamic bias means.

9. The apparatus of claim 8, wherein the integrator means comprises a differential pair means that is responsive to UP and DOWN signals, a capacitor means, and a common-mode feedback means that is arranged to sense the output of the integrator means.

10. The apparatus of claim 8, further comprising a phase-detector means that is arranged to provide UP and DOWN signals in response to the monitored sampling signals.

11. The apparatus of claim 1, further comprising an input multiplexer circuit that is arranged to selectively couple the first analog input port to the second analog input port for interleaved operation, and selectively decouple the first analog input port from the second analog input port for non-interleaved operation.

12. The apparatus of claim 1, further comprising a clock selection multiplexer circuit that is arranged to selectively configure the first clock signal in phase with the second clock signal for non-interleaved operation, and selectively configure the first clock signal substantially 180° out of phase with respect to the second input clock signal.

13. The apparatus of claim 1, wherein each of the first and second analog-to-digital converter circuits includes a track and hold circuit that is responsive to a respective one of the first and second clock signals, and wherein the adjustment control circuit is arranged to adjust the edge rate of a clock edge associated with at least one of the first and second clock signals such that the sampling instant for the track and hold circuits are uniformly spaced in time.

14. The apparatus of claim 1, wherein each of the analog-to-digital converter circuits comprises a one-shot circuit that is arranged to generate a sampling pulse in response to the respective one of the first and second clock signals, and wherein an output of the one-shot circuit is coupled to the adjustment control circuit.

15. The apparatus of claim 1, wherein each of the analog-to-digital converter circuits comprises a one-shot circuit that is arranged to generate a sampling pulse in response to the respective one of the first and second clock signals, and wherein an output of each one-shot circuit is coupled to the adjustment control circuit via a buffer circuit.

16. The apparatus of claim 1, wherein the adjustment control circuit comprises a phase detector circuit, an integrator circuit, and a bias adjustment circuit, wherein: the phase detector circuit is arranged to provide UP and DOWN signals in response to the monitored sampling signals, the integrator circuit is arranged to provide at least one sense signal in response to the UP and DOWN signals, and the bias adjustment signal is arranged to adjust the at least one control signal in response to the at least one sense signal.

17. The apparatus of claim 1, wherein the adjustable delay circuit of the clock is arranged to respond to the at least one control signal to provide at least one of: a delayed rising edge, a delayed falling edge, an increased slope rising edge, a decreased slope rising edge, an increased slope falling edge, and a decreased slope falling edge.

18. The apparatus of claim 1, wherein the adjustable delay circuit comprises an inverter circuit that has a first biased current source that controls a rising edge speed associated with an adjusted clock signal, and a second biased current source that controls a falling edge speed associated with the adjusted clock signal, wherein the at least one control signal is arranged to vary a biasing associated with at least one of the first biased current source and the second biased current source.

19. A method of adjusting sampling clock intervals, comprising:
  monitoring a first sampling clock associated with a first analog-to-digital converter;
  monitoring a second sampling clock associated with a second analog-to-digital converter;
  comparing a phase associated with the monitored sampling clocks to provide UP and DOWN control signals;
  integrating the UP and DOWN signals to provide at least one error signal;
  adjusting at least one bias voltage in response to the at least one error signal; and
  changing a delay time associated with an adjustable delay circuit in response to the at least one bias voltage, wherein the delay time associated with the adjustable delay circuit is associated with at least one of the first and second sampling clocks.

20. A method as in claim 19, further comprising: filtering the UP and DOWN control signals.

21. An apparatus for aligning clock edges associated with sampling in an analog-to-digital converter system that includes first and second analog-to-digital converters, the apparatus comprising:
  a means for monitoring a first sampling clock associated with the first analog-to-digital converter;
  a means for monitoring a second sampling clock associated with the second analog-to-digital converter;
  a means for comparing a phase associated with the monitored sampling clocks to provide UP and DOWN control signals;
  a means for varying at least one error signal in response to the UP and DOWN signals to provide at least one sense signal;
  a means for adjusting at least one control signal in response to the at least one sense signal; and
  a means for adjusting at least one of a rising edge and a falling edge associated with an adjustable delay circuit in response to the at least one control signal, wherein the delay time associated with the adjustable delay circuit is associated with at least one of the first and second sampling clocks relative to an input clock signal.

* * * * *

UNITED STATES PATENT AND TRADEMARK OFFICE
CERTIFICATE OF CORRECTION

| | | |
|---|---|---|
| PATENT NO. | : 7,068,195 B1 | Page 1 of 1 |
| APPLICATION NO. | : 11/119199 | |
| DATED | : June 27, 2006 | |
| INVENTOR(S) | : Christopher Alan Menkus | |

It is certified that error appears in the above-identified patent and that said Letters Patent is hereby corrected as shown below:

Column 6, Line 30: "a tranconductance, hereafter Gm," should read --a transconductance, hereafter Gm --

Column 6, Line 61: "is an timing diagram" should read --is a timing diagram--

Signed and Sealed this

Sixth Day of March, 2007

JON W. DUDAS
*Director of the United States Patent and Trademark Office*